United States Patent [19]
Cole et al.

[11] Patent Number: 5,401,687
[45] Date of Patent: Mar. 28, 1995

[54] PROCESS FOR HIGH DENSITY INTERCONNECTION OF SUBSTRATES AND INTEGRATED CIRCUIT CHIPS CONTAINING SENSITIVE STRUCTURES

[75] Inventors: Herbert S. Cole, Burnt Hills; Theresa A. Sitnik-Nieters, Scotia; Bernard Gorowitz, Clifton Park, all of N.Y.

[73] Assignee: Martin Marietta Corporation, King of Prussia, Pa.

[21] Appl. No.: 46,299

[22] Filed: Apr. 15, 1993

[51] Int. Cl.$^6$ .............. H01L 21/28; H01L 21/56; H01L 21/60; H01L 21/58
[52] U.S. Cl. .................. 437/182; 437/215; 437/184; 257/776; 257/522
[58] Field of Search ........... 437/182, 184, 974, 215, 437/927; 257/776, 522

[56] References Cited

U.S. PATENT DOCUMENTS

| | | | |
|---|---|---|---|
| 4,617,085 | 10/1986 | Cole, Jr. et al. | 156/643 |
| 4,783,695 | 11/1988 | Eichelberger et al. | 357/65 |
| 4,835,704 | 5/1989 | Eichelberger et al. | 364/490 |
| 4,878,991 | 11/1989 | Eichelberger et al. | 156/630 |
| 4,894,115 | 1/1990 | Eichelberger et al. | 156/643 |
| 4,903,110 | 2/1990 | Aono | 357/51 |
| 4,933,042 | 6/1990 | Eichelberger et al. | 156/239 |
| 5,017,509 | 5/1991 | Tuckerman | 437/182 |
| 5,073,814 | 12/1991 | Cole, Jr. et al. | 357/54 |
| 5,161,093 | 11/1992 | Gorczyca et al. | 361/414 |
| 5,169,678 | 12/1992 | Cole et al. | 427/555 |
| 5,206,712 | 4/1993 | Kornrumpf et al. | 361/393 |
| 5,264,246 | 11/1993 | Ikeno | 427/240 |

*Primary Examiner*—Olik Chaudhuri
*Assistant Examiner*—David E. Graybill
*Attorney, Agent, or Firm*—Brian J. Rees; Geoffrey H. Krauss

[57] ABSTRACT

In a method for preserving an air bridge structure on an integrated circuit chip used in an overlay process, a patternable protective layer is applied for providing mechanical strength to prevent deformation during subsequent processing. A polymeric film layer is applied over the chip and protective layer, and interconnections are fabricated through the polymeric film layer. The polymeric film layer is removed from the area over the air bridge structure. The patternable protective layer is then removed, leaving the resultant structure with an undamaged air bridge which is free of residue.

30 Claims, 4 Drawing Sheets

PROCESS FOR HIGH DENSITY INTERCONNECTION OF SUBSTRATES AND INTEGRATED CIRCUIT CHIPS CONTAINING SENSITIVE STRUCTURES

BACKGROUND OF THE INVENTION

1. Field of the Invention

This invention is generally related to integrated circuit packaging and, more particularly, to packaging of high speed devices having sensitive structures, such as air bridge structures.

2. Description of the Related Art

In the packaging of very large scale integrated circuit devices, much space is taken up by connections between integrated circuit (IC) chips and adjacent chips and/or other devices. In a present practice designed to reduce packaging sizes, a polymer film overlay covers a plurality of integrated circuit chips adjacent to one another on an underlying substrate. The polymer film provides an insulated layer upon which is formed a metallization pattern for interconnection of individual circuit chips. A significant advantage of these packaging configurations is the ability to remove one or more of these interconnection layers so as to provide a multitude of arrangement and testing capabilities.

Methods for carrying out a high density interconnection (HDI) process using overlays are described in Eichelberger et al., U.S. Pat. No. 4,783,695, issued Nov. 8, 1988, and in Eichelberger et al., U.S. Pat. No. 4,933,042, issued Jun. 12, 1990, both of which are commonly assigned and hereby incorporated by reference. Additionally, it is desirable to provide via openings or apertures in the polymer dielectric layer so as to be able to provide electrical connection between various parts of a chip or between several chips. Commonly assigned Eichelberger et al., U.S. Pat. No. 4,894,115, issued Jan. 16, 1990, which is hereby incorporated herein by reference, describes embodiments for providing such apertures. Furthermore, methods for gaining access to and replacing a defective integrated circuit chip are described in commonly assigned Eichelberger et al., U.S. Pat. No. 4,878,991, issued Nov. 7, 1989, which is hereby incorporated by reference.

For the fabrication of certain multi-chip module (MCM) devices, high performance is attained by using high speed devices made of materials such as GaAs (gallium arsenide), for example, some of which have chip wiring including air bridge structures. The thermal stability requirements of certain GaAs chips restrict their processing range to temperatures under 260° C. Therefore, for processing modules with these chips, a lower melt viscosity adhesive system was developed to provide a procedure compatible with processing temperatures below 260° C., and is disclosed in commonly assigned Lupinski et al., "Plasticized Polyetherimide Adhesive Composition and Usage", U.S. Pat. No. 5,300,812, which is herein incorporated by reference.

Air bridge structures provide improved signal propagation and reduced capacitive coupling at high frequencies (in the gigahertz range) over conventional chip wiring. To maintain the performance advantage of having air as the dielectric medium, the MCM fabrication process must preserve the air bridge structures. For example, allowing adhesive underneath air bridges with a dielectric constant of about 3 instead of with a dielectric constant of 1 will cause additional capacitive loading and reduction of signal magnitude at high frequencies.

One high density interconnection (HDI) technique for chips with air bridge structures is to fabricate a multi-layer interconnection structure by laminating polymer layers and forming electrical conductor patterns and to then selectively remove the polymer layers from the air bridge regions of the chip using a large area laser ablation process. A plasma treatment is used to clear any remaining residue. This technique is suitable for large air bridge structures with good structural integrity. Certain high performance chips with fragile air bridge structures, however, can be crushed or deformed when an initial layer of polymer is laminated.

In another technique, a low temperature, low melt viscosity adhesive is used between the overlay polymer and chip during lamination to prevent thermal degradation of sensitive chips. The adhesive flows under air bridge structures, however, and cannot be completely removed after large area ablation.

SUMMARY OF THE INVENTION

Accordingly, an object of the invention is to provide a method of fabricating MCMs with clean air bridge structures.

Another object of the invention is to provide mechanical support of air bridge structures and other sensitive structures during lamination and all other processing sequences which, after large area ablation, can conveniently be removed without degradation of the module.

Briefly, according to a preferred embodiment of the invention a method for preserving a sensitive structure on a chip having chip pads and supported by a substrate includes the step of applying a protective layer over the chip and the substrate and removing the protective layer from a portion of the chip and the substrate. The protective layer can be removed either in areas everywhere except for the area surrounding the sensitive region or in areas everywhere except for the area under the sensitive structure. A polymeric film layer is applied over the chip and the substrate, and vias aligned with predetermined chip pads are provided in the polymeric film layer. A pattern of electrical conductors is provided on the polymeric film layer interconnecting the chip in a circuit. The polymeric film layer is then removed from the area over the sensitive region. The remainder of the protective layer is removed.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, with like numerals representing like components, in which:

DETAILED DESCRIPTION OF A PREFERRED EMBODIMENT OF THE INVENTION

Although the following discussion addresses the primary concern of protecting air bridges on chips, the techniques disclosed can be used with various types of sensitive structures in micro-electronic circuitry which need protection during processing. These structures include wiring and other protrusions which need to be clean for optimum use. Additionally, sensitive structures are not only situated on chips, but can also be found on substrates on which chips are placed for multichip module fabrication.

Figure 1:
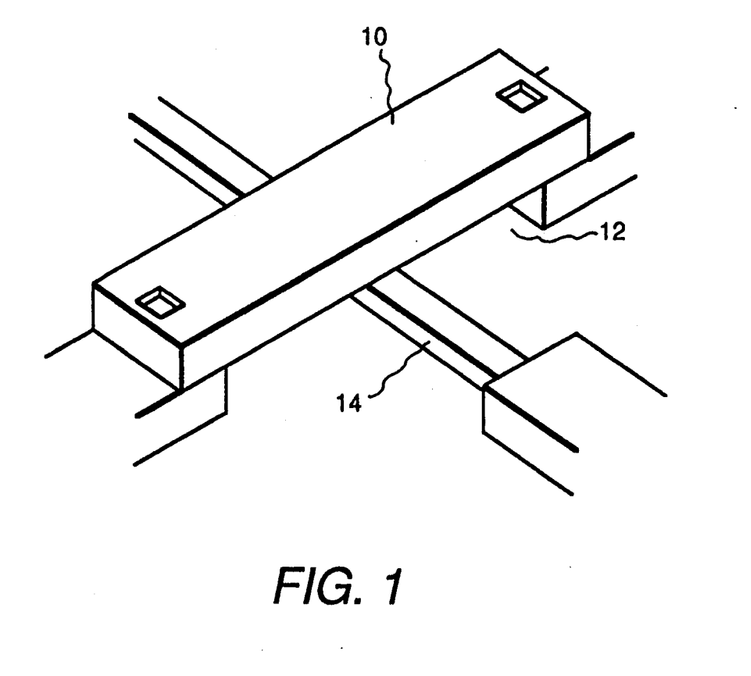
FIG. 1 is a perspective view of an air bridge structure for micro-electronic circuitry.

FIG. 1 is a perspective view of an air bridge structure 10 which is part of the wiring fabricated on a substrate or an integrated circuit chip (not shown). Lead 14 is an electrical conductor line which runs under air bridge structure 10. Between air bridge structure 10 and lead 14 is an ambient atmosphere 12, such as air. The air bridge structure, which may comprise any electrically conductive material, generally comprises gold. Chips with pre-fabricated air bridge structures are commercially available from suppliers of chips for operation at very high frequencies. These chips typically comprise gallium arsenide.

Figure 2A:
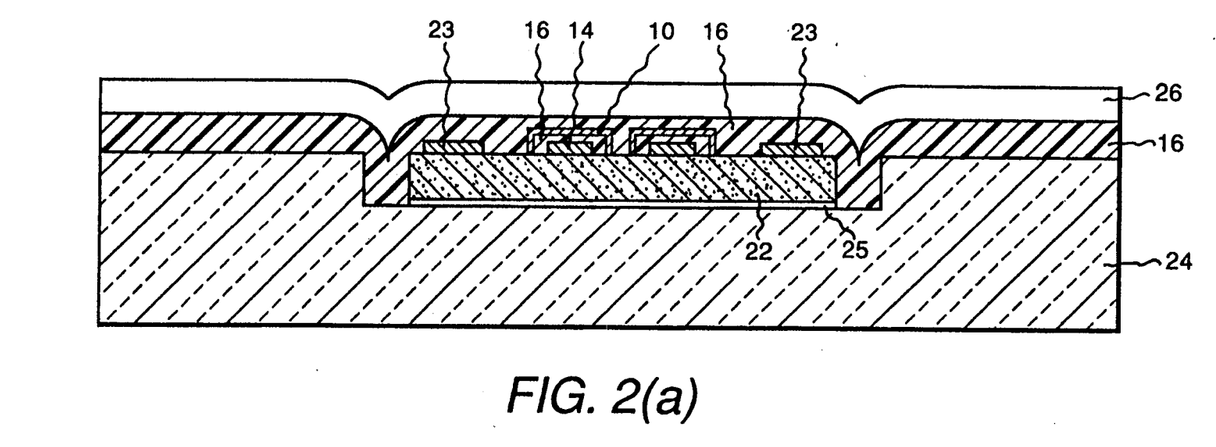
FIGS. 2(a)–(e) are sectional side views of steps in a procedure for using a protective layer to provide mechanical support for an air bridge structure in micro-electronic circuitry.

FIGS. 2(a)–(e) are sectional side views of steps in a procedure for providing mechanical support for an air bridge structure. In FIG. 2(a), an integrated circuit chip 22 including chip pads 23 and air bridge structure 10 is shown adhered with an adhesive 25 to a substrate 24, which may comprise any appropriate structural material, for interconnection processing. Then a protective layer 16 is applied over the surface of the chip and substrate. Preferably protective layer 16 comprises a thermally stable material which is conveniently patternable, has high melt viscosity, and is removable in solvents which will not chemically attack the subsequently applied HDI structure.

Figure 2B:
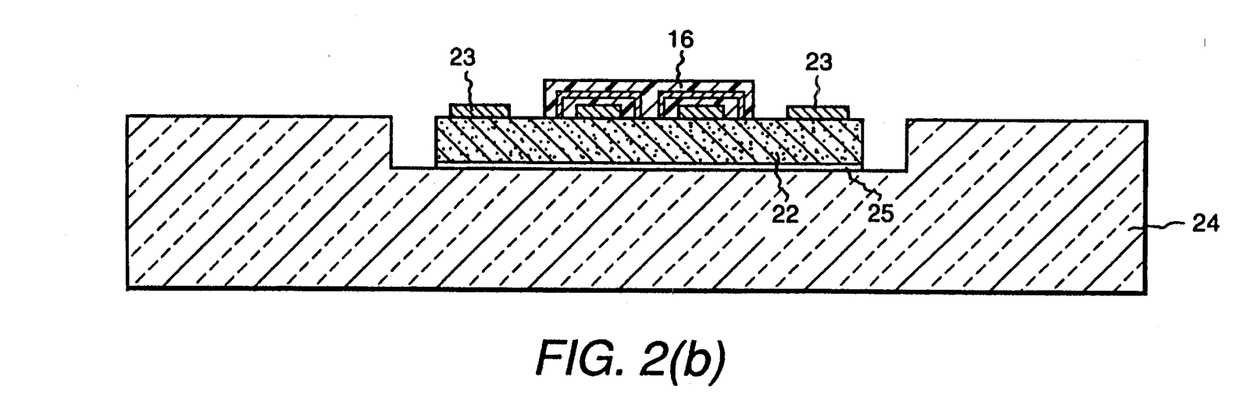

Protective layer 16 is preferably either a photoresist material or a material patternable by photoresist. After protective layer 16 (and a photoresist 26, if needed) is applied to the chip and substrate, the substrate is exposed to actinic radiation, solvent developed, and rinsed so that protective layer 16 remains only in the air bridge region of chip 22, as shown in FIG. 2(b). Protective layer 16 provides mechanical strength and prevents crushing or deformation during subsequent overlay laminations.

In an alternate embodiment, rather than placing the chip on a substrate prior to providing the protective layer, the protective layer is applied to the air bridge structure prior to the chip's placement on the substrate.

Figure 2C:
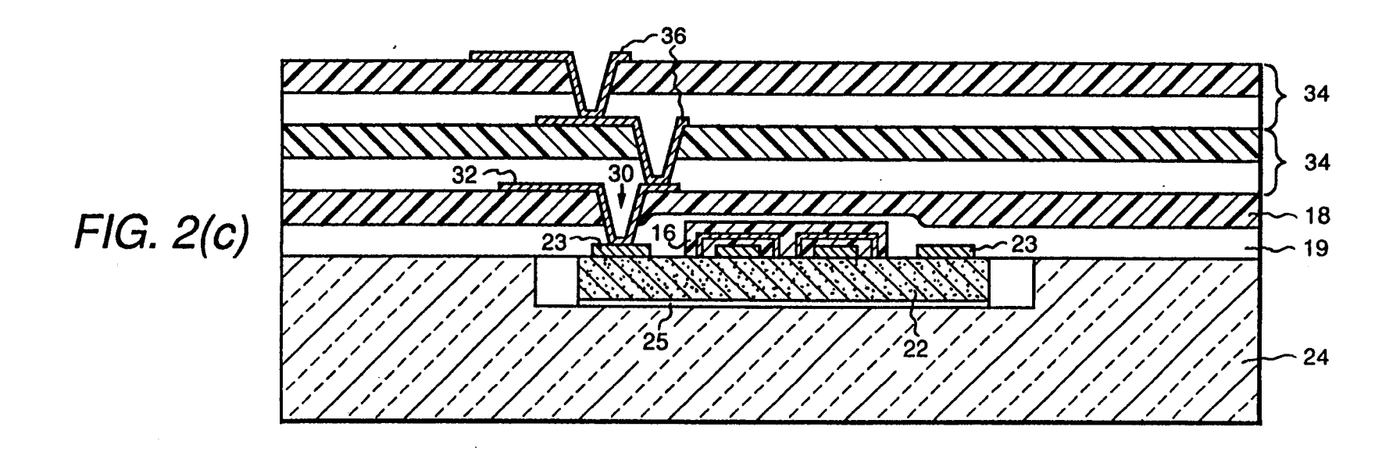

As shown in FIG. 2(c), a polymeric film layer 18 has been applied to the structure shown in FIG. 2(b). Polymeric film layer 18 may be added in any manner. Conventional methods of applying overlay 18 are lamination, spin coating, and spray coating. Aforementioned U.S. Pat. No. 4,783,695 describes the basic HDI overlay and metallization procedure. Aforementioned 4,933,042 describes a preferred method of lamination by using an adhesive, shown as adhesive layer 19 in FIG. 2(c), between the polymeric film layer and the chip and substrate.

After polymeric film layer 18 is cooled to room temperature, vias 30 and a pattern of electrical conductors 32 may be applied using conventional HDI techniques, such as those described in aforementioned U.S. Pat. No. 4,783,695. Aforementioned U.S. Pat. No. 4,894,115 and Eichelberger et al., U.S. Pat. No. 4,835,704, issued May 30, 1989, both of which are commonly assigned and herein incorporated by reference, describe preferred methods of via fabrication and chip interconnection. Additional layers of polymeric films 34 and electrical conductors 36 can be applied, if desired, using conventional HDI techniques.

Figure 2D:
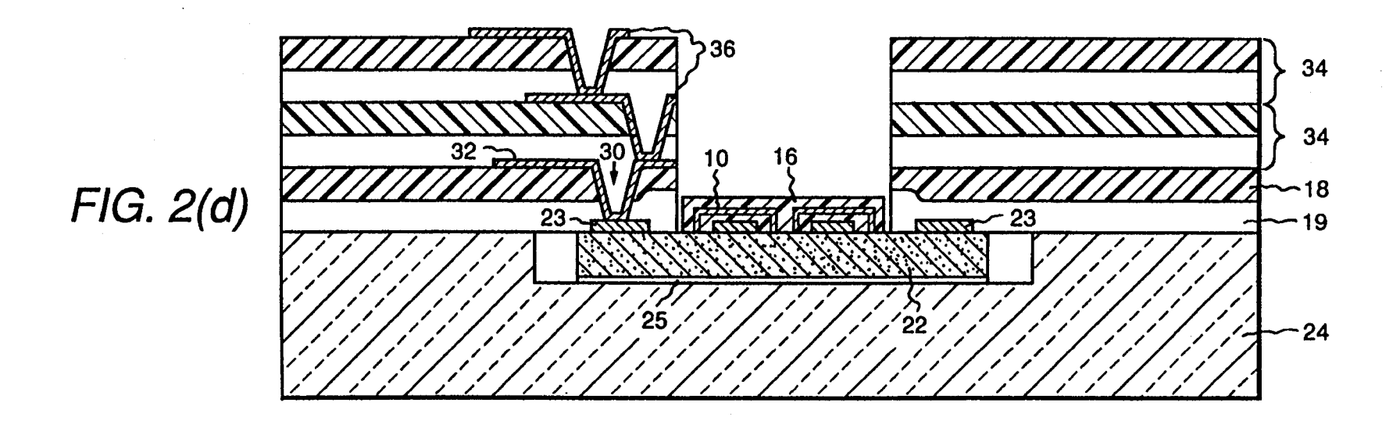

After the interconnect structure is completed, polymeric film layer 18 and any additional polymeric film layers 34 are removed from the air bridge region of the MCM, as illustrated in FIG. 2(d). In one embodiment, the layers are removed using an argon ion laser at a wavelength of 351 nm. A large area of ablation may be provided using the scanning method described in aforementioned U.S. Pat. No. 4,894,115.

Figure 2E:
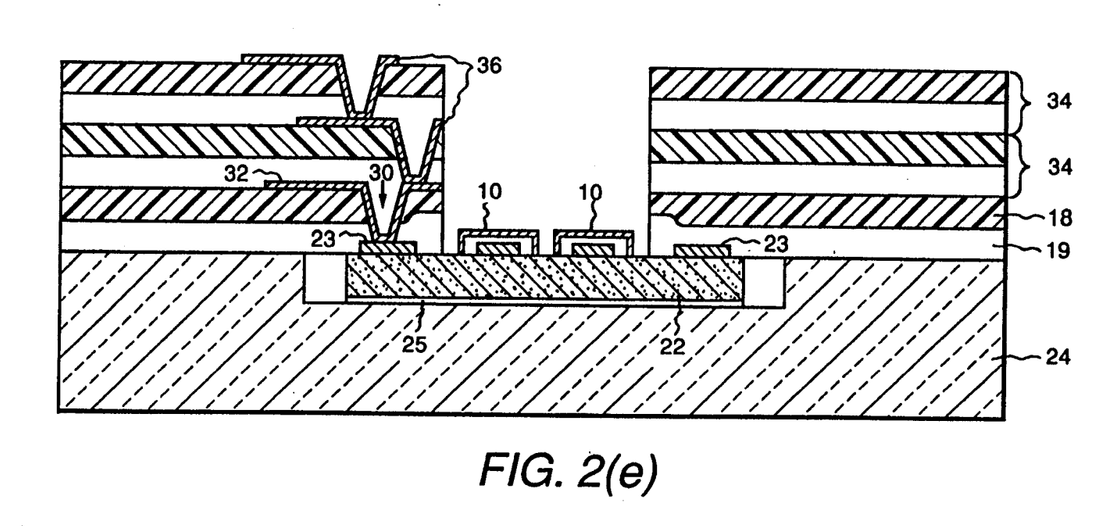

Protective layer 16, as shown in FIG. 2(d), can then be removed from the air bridge 10 region, as shown in FIG. 2(e). The preferred method for such removal is to immerse the substrate in a solution to dissolve protective layer 16. The solution must be one that will dissolve protective layer 16 but not the air bridge circuitry, the chips, the substrate, or any of the other polymeric film layers used in the HDI fabrication process. After the MCM is immersed in solution, the MCM is preferably rinsed in clean solution repeatedly and spun dry to yield air bridge structures free of contaminant.

Figure 3:
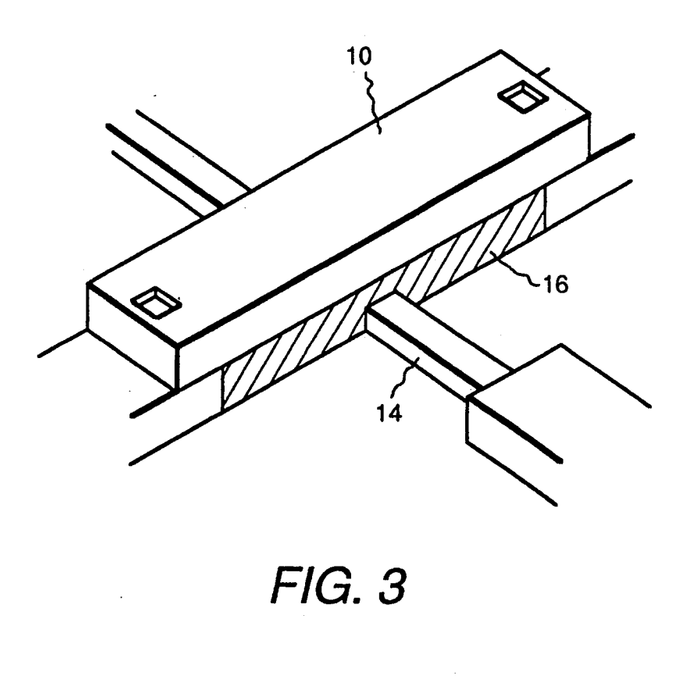
FIG. 3 is a perspective view of a step in another procedure for providing mechanical support for an air bridge structure in micro-electronic circuitry.

FIG. 3 is a perspective view of the result of a similar procedure for providing mechanical support for an air bridge structure. Protective layer 16 is added in the same manner as described with reference to FIG. 2(a). But unlike the exposure process discussed with respect to FIG. 2(b), the protective layer must be a positive photoresist, and there is a blanket exposure of the protective layer to actinic radiation, followed by developing and rinsing such that only the regions under air bridge structures 10, which were not exposed, remain intact. The remainder of the procedure involves applying interconnect layers, ablating polymeric film layers, and removing the protective material, as discussed with respect to FIGS. 2(c)–2(e).

Various materials have been found to effectively provide air bridge protection during the HDI fabrication process. The key requirements are that the material can be reproducibly coated, patterned and subsequently removed after complete fabrication of the HDI module. The decision of which material to use in a particular application of the invention involves consideration of two exemplary techniques: a process which permits a 260° C. lamination of polymeric film layer 18 and a process which allows a 185° C. lamination of the polymeric film layer. The lower temperature lamination process can be used with a larger number of materials than the higher temperature process because more materials can survive the processing temperatures and thus be used as protective layers. However, the preferred embodiment uses the higher temperature lamination process which provides superior rework capabilities.

EXAMPLE 1

A polymer available from Brewer Science Corporation, Rolla, Mo., sold under the name "PIRL" (polyimide release solution), can be coated uniformly on a variety of substrates, patterned using photoresist processing, and dissolved in dilute organic bases even after thermal baking to temperatures in excess of 260° C. A coating solution was prepared by mixing 40 g of the "PIRL" material (25% polymer and 75% N-methyl pyrrolidone) with 60 g of anisole. The solution was rolled on a rolling mill to insure complete miscibility and then filtered through 5 μm pore size filter apparatus. A 4 to 6 μm coating of protective layer 16 was obtained by spraying using a "Zycon Spray Coater, model #9500", supplied by Zycon Corp., Mt. Vernon, N.Y., with predetermined flow rates and pressure for a specific thickness. The preferred thickness was on the order of 4–6 μm, however by appropriate adjustment of the spray coating equipment, films as thin as 1 μm and as thick as 15 μm were possible. GaAs chips were mounted in pockets previously milled in alumina substrates using a commercially available epoxy die attach adhesive (available from Ablestik Labs, Gardena, Calif., under the name "84-1LMI-T"). After spray coating with the "PIRL" polyimide release solution, the substrates were given hot plate bakes of 20 minutes at 110° C. and 30 minutes at 150° C.

The protective layer was then coated with a photoresist of the type utilizing aqueous base for development of resist images. One such material used in this work was a resist from Armstrong Industries sold under the trade-name Fanton 360. A layer 15 μm thick was spray coated over the "PIRL" polymide release layer on chips and substrate as shown in FIG. 2(a). The resist was baked for 10 minutes at 100° C. after coating. The resist was exposed to actinic radiation by irradiating it with a computer controlled argon ion laser operating at a wavelength of 351 nm to selectively harden the layer. The resist was then developed using dilute sodium carbonate (1–2% aqueous solution) during which the unexposed resist and underlying "PIRL" polymide release polymer were redissolved to yield the desired protective layer pattern on the surface of the GaAs chips. At this point in the process, the air bridge structures were completely covered with the protective layer, but other regions of the chips such as the chip pads 23 were free of polymer. This is shown schematically in FIG. 2(b). It is important to have clean chip pads at this point to obtain adhesion of the first polymeric film layer during the lamination step. Prior to lamination, the patterned photoresist was removed. The substrates were first given a 90° C. bake for 45 minutes to insure removal of residual developer and then immersed and agitated in a 60/40 mixture of 4-methyl anisole and acetone.

Samples were then baked for 5 minutes at 110° C., 5 minutes at 150° C., 5 minutes at 200° C., and 30 minutes at 250° C. to harden the "PIRL" protective polymer. Polymeric film layer 18 was applied by laminating a composite film of 1 mil "KAPTON" polyimide ("KAPTON" is a trademark of E.I. dupont de Nemours and Co.) with a thermoplastic adhesive, such as 12 μm thick "ULTEM/BENZOFLEX" polyetherimide resin ("ULTEM" is a trademark of General Electric Co., Pittsfield, Mass., for a polyetherimide resin, and "BENZOFLEX" is a trademark of Velsicol Chemical Corp. for pentaerythritol tetrabenzoate). The "ULTEM/BENZOFLEX" polyetherimide resin lamination process is described in aforementioned U.S. Pat. No. 5,300,812. The polymeric film layer was placed, adhesive side down, over the chips and substrate in a chamber which can be evacuated and heated. The chamber was evacuated and heated to 260° C. at which point a pressure of 10–45 psi was applied for 10 minutes, although this time can range from a few minutes to 45 minutes. The process does not require lamination at 260° C., however temperatures ranging from 240° C. to 260° C. are preferred. The chamber was then cooled to room temperature and the substrate was removed from the chamber. Via holes to chip pads on the chip were laser drilled using an argon ion laser operating at a wavelength of 351 nm under computer control. A thin layer of titanium and then a thin layer of copper were sputtered, a 4 μm thick layer of copper was electroplated, and a thin top layer of titanium was sputtered. A photoresist was used to pattern the metal. If desired, additional layers of polymeric film and metal can be added using similar processing steps to complete the interconnect structure. Additional upper polymeric film layers may be applied using a siloxane polyimide-epoxy adhesive system as described in commonly assigned Gorczyca et al., U.S. Pat. No. 5,161,093, issued Nov. 3, 1992, which is herein incorporated by reference. This completed structure is shown in FIG. 2(c).

For optimum performance, the polymeric film must be removed from the air bridge regions of the GaAs device. A computer controlled argon ion laser was used to selectively ablate the polymeric film layers above the air bridge region. This was accomplished using multiple scan passes by the laser operating at a wavelength of 351 nm. The entire polymeric film layer was selectively removed down to the "PIRL" polymide protective polymer. The substrate was then $O_2$ plasma ashed to remove the last traces of polymeric film, resulting in the structure shown in 2(d).

The remaining (unprotected) "PIRL" polymide polymer was removed by soaking the polymer in a dilute organic base release solution available from Brewer Science, Rolla, Mo. and sold under the name "A-1", and which comprises ethanol amine, glycol ethers, and water. Test substrates were immersed in this solution at 50° C. for between 5 minutes and 60 minutes. The exact time depended on the thickness of "PIRL" polymide to be removed and its thermal history. Thicker "PIRL" polymide and higher processing temperatures of the PIRL and interconnect layers required that the substrate and chip spend more time in the bath to effectively remove all of the protective material. In the preferred embodiment, 20 minutes was sufficient to achieve complete removal. After appropriate soaking, the substrate was rinsed for 5 minutes in 50/50 deionized water/methanol, 5 minutes in deionized water, and 2 minutes in methanol. The substrates were then baked for 20 minutes at 100° C. to insure that all traces of water and solvent were removed. The final structure is shown in 2(e).

To confirm that all of the "PIRL" polymide polymer was removed, the Au air bridges on the GaAs chip were etched and the underlying regions visually inspected. Test samples which were processed to the point of polymeric film ablation but not exposed to the "A-1" release solution, as shown in FIG. 2(d), had the air bridges etched and the "PIRL" polymide polymer was visually present under the bridges. Test samples which went through the final solvent soak process showed no polymer and looked identical to unprocessed GaAs chips which had air bridges etched away. Electrical tests at high frequency also confirmed that the polymeric film material was removed from the air bridge region by detecting improved output signals over chips which were processed without this protection procedure.

EXAMPLE 2

A solution of "PMMA" (polymethyl methacrylate, sold under the name "ELVACITE 2041" PMMA solution by E.I. DuPont de Nemours and Co.) was prepared by dissolving 15 g of dry PMMA in 85 g of toluene. This solution was used to coat over GaAs chips with air bridge structures. Spin coating at 2500 rpm followed by a bake of 30 minutes at 110° C. resulted in a uniform 4–6 $\mu$m thick coating. Since "PMMA" will depolymerize in the presence of UV, the "PMMA" served as a positive working resist. The coated modules were exposed to a blanket ultra violet (UV) light source, in this case a 1 KW mercury vapor lamp, for a period of 10 to 20 minutes. The exposed polymer was then immersed in a mixture of methyl isobutyl ketone and methanol to selectively dissolve the exposed polymer. The exposed regions contained significantly lower molecular weight polymer chains and were soluble in the solvent blend whereas the unexposed regions were unaffected. After development, the only regions of the chip containing polymethyl methacrylate were the regions under the air bridges. The polymer 16 under the air bridges is shown schematically in FIG. 3. The substrate was given an $O_2$ plasma ash to clean any residue from the chip pads and was then ready for lamination. The polymeric film layer lamination was carried out at 185° C. using the siloxane-polyimide-epoxy adhesive system used for upper layer polymeric film processing in example 1 (the process does not require lamination at 185° C., however temperatures ranging from 160° C. to 200° C. are preferred). Patterned metallization and additional layers of polymeric film and metal were applied to complete the module. The polymeric film layers over the air bridge structures were then laser ablated using an excimer laser operating at a wavelength of 248 nm. The substrate was plasma ashed to remove residual polymeric film material, and then immersed in an aromatic hydrocarbon, comprising toluene, for 1 hour, to soak the "PMMA" from under the air bridges. The substrate was next baked for 20 minutes at 100° C. to remove residual solvent. The air bridge regions of the GaAs chip appeared as shown schematically in FIG. 1.

EXAMPLE 3

A solution of gelatin was prepared at a 10% (by weight) concentration in water. A small amount of ammonium dichromate (5% by weight of gelatin) was dissolved in the solution and the polymer blend then coated on GaAs chips mounted in a ceramic substrate. The gelatin layer acted as a negative resist, resulting in the exposed regions being crosslinked. The layer was exposed to the argon ion laser operating at a wavelength of 351 nm and developed in warm water. The substrate was then baked for 20 minutes at 100° C. and given an $O_2$ plasma ash to provide clean chip pad areas on the chip, as shown in FIG. 2(b). The substrate was then laminated using the siloxane-polyimide-epoxy adhesive system and conditions described in example 2, resulting in the structure shown in FIG. 2(c). After fabrication of the entire interconnect structure, the polymeric film was ablated from the air bridge regions using the scanning argon ion laser operating at a wavelength of 351 nm, resulting in the structure shown in FIG. 2(d). Afar $O_2$ plasma ashing to remove residual polymeric film, the substrate was soaked in a solution of sodium hypochlorite (bleach) for 5 minutes to redissolve the crosslinked gelatin. The resultant air bridge structures were thus free of polymeric film and organic material, as shown in FIG. 2(e).

EXAMPLE 4

A solution of amorphous "TEFLON (AF-1600)" flourocarbon polymer solution, sold by E.I. Dupont de Nemours and Co., was prepared by dissolving 7 g of dry "AF-1600" in a fluorocarbon solvent, "FLUORINERT FC-75" flourocarbon solvent, sold by 3M Corp., Minneapolis, Minn. The solution was spin coated at 1000 rpm over GaAs chips 22 with air bridge structures 10. The spin coating was followed by baking for 15 minutes at 100° C., 15 minutes at 150° C., and 15 minutes at 250° C., resulting in a uniform 4–5 $\mu$m thick protective layer 16. This polymer was soluble after thermal processing at 260° C., and therefore is compatible with the preferred 260° C. lamination process discussed in Example 1. The process for using "AF-1600" is similar to the process illustrated by FIGS. 2(a)–2(e), except that the patterning of "AF-1600" is achieved by using a thin adhesion layer, shown as 110 in FIG. 4.

Figure 4:
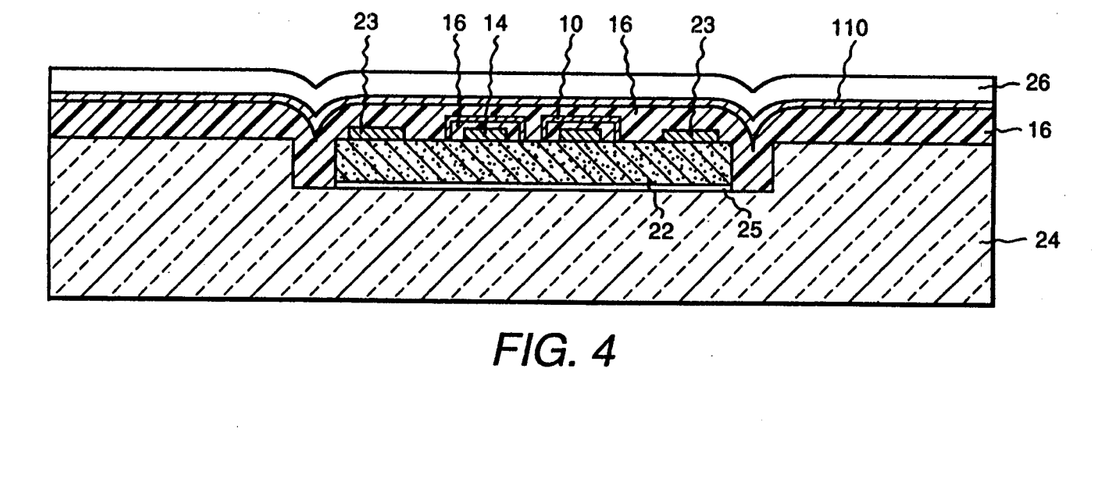
FIG. 4 is a sectional side view illustrating an embodiment similar to that shown in FIG. 2(a), further including an adhesion layer.

After "TEFLON (AF-1600)" fluorocarbon polymer solution (protective layer 16) was coated on chip 22 and substrate 24, the film was patterned over the sensitive areas of the chip by first applying a thin adhesion layer 110 (about 90Å) of TiW and a layer 26 of "Fanton 360" photoresist. The adhesion layer was used to provide adhesion between the photoresist and the "AF-1600" layer, and other materials, preferably metals, can alternatively be used to achieve adhesion. The photoresist was applied, exposed to actinic radiation, and developed as described in Example 1, resulting in regions of the substrate with uncovered TiW. The substrate was then placed in an "Anelva RIE" etcher (Anelva Corp., Japan) and the uncovered portion of the adhesion layer of TiW was etched in a $SF_6$, $Cl_2$, $O_2$ gas mixture for 1–2 minutes. The gas mixture was then switched to $O_2$/Ar to etch the portion of "AF-1600" which became uncovered after the TiW etch. The photoresist material was next removed by soaking the chip in acetone and baking the chip for 30 minutes at 100° C. At this point, the chip was identical to that shown in FIG. 2(b), except that there is adhesion layer 110 covering protective layer 16.

The interconnect structure was fabricated and polymeric film layers 18 (shown in FIGS. 2(c)–2(e)) were laser ablated over the air bridge regions in the same manner as described in Example 1. During laser ablation of the polymeric film layers, the thin TiW layer was also ablated, leaving only the "TEFLON (AF-1600)" fluorocarbon polymer solution polymer over the air bridge 10 regions, similar to the structure shown in FIG. 2(d). The "TEFLON (AF-1600)" flourocarbon polymer solution polymer was then removed by soaking the entire chip in "FLUORINERT FC-75" flourocarbon solvent for 1 hour at 60° C. "FLUORINERT FC-75" flourocarbon solvent was found to have no effect on the polymeric film layers or components used in the HDI fabrication process, and left a structure identical to that shown in FIG. 2(e). To confirm that all the protective layer of "TEFLON (AF-1600)" flourocarbon polymer solution was removed by the solvent, the gold air bridges were etched and the underlying regions were visually inspected.

Additional resists and protective materials can be used for providing bridge protection in the embodiments described with reference to FIGS. 1–4. The key requirements are that the material be patternable, have melt viscosity sufficiently high to remain in place without flow during lamination, and be removable in a solvent system which will not attack other organic or inorganic components of the multi-chip module. Such protective materials include photoresists, high melting point waxes, acetone, acetone soluble polymers such as cellulose acetate, and water and alcohol soluble polymers.

The main difference between the two processing temperatures is that one (described in examples 1 and 4) uses a first polymeric film layer adhesive which is thermoplastic and thus more readily removable for rework. Because of this capability, this process is the preferred embodiment. The lower temperature process described in examples 2 and 3 uses a thermosetting adhesive system which has a low modulus of elasticity and therefore undergoes lower stress, which in certain applications is important.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for preserving a sensitive structure on an integrated circuit chip which, when exposed to polymer lamination, would deform, having chip pads thereon and supported by a substrate, comprising the steps of:
   applying a solvent-removable protective layer over said sensitive structure to support said structure on all sides, wherein said protective layer does not significantly change solubility characteristics upon exposure to temperatures of about 260° C.;
   applying a high density interconnect polymeric layer over said chip and said substrate;
   providing at least one via in said polymeric film layer aligned with a predetermined one of said chip pads;
   providing a pattern of electrical conductors on said polymeric film layer extending through said at least one via and interconnecting said chip in a circuit;
   removing said polymeric film layer from the area over said sensitive structure; and
   removing said solvent-removable protective layer.

2. The method of claim 1, wherein the step of removing said polymeric film layer from said area over said sensitive structure comprises laser ablating said polymeric film layer in the area over said sensitive structure.

3. The method of claim 1, wherein the step of removing the remainder of said protective layer comprises immersing said chip and said substrate in a solvent for said protective layer.

4. The method of claim 1, wherein the step of applying a polymeric film layer over said chip and said substrate comprises vacuum laminating said film layer over said chip and said substrate.

5. A method for preserving an air bridge structure on an integrated circuit chip having chip pads thereon, comprising the steps of:
   applying a solvent-removable protective layer over said air bridge structure to support said structure on all sides, wherein said protective layer does not significantly change solubility characteristics upon exposure to temperatures of about 260° C.;
   positioning said chip on a substrate;
   applying a polymeric film layer over said chip and said substrate;
   providing vias in said polymeric film layer aligned with predetermined ones of said chip pads;
   providing a pattern of electrical conductors on said polymeric film layer extending through said vias for interconnecting said chip in a circuit;
   removing said polymeric film layer from the area over said air bridge structure; and
   removing said protective layer.

6. The method of claim 5, wherein the step of applying a protective layer over said air bridge structure comprises applying said protective layer over said chip and removing said protective layer from a portion of said chip, said portion not including said air bridge region.

7. The method of claim 5, wherein the step of applying a protective layer over said air bridge structure is performed after said chip is positioned on said substrate.

8. The method of claim 5, wherein the step of applying a protective layer over said air bridge structure is performed before said chip is positioned on said substrate.

9. The method of claim 6, wherein the step of removing said protective layer from said portion of said chip comprises:
   applying a layer of photoresist over said protective layer;
   exposing said layer of photoresist to actinic radiation in predetermined areas;
   developing said layer of photoresist so as to remove said layer of photoresist and said protective layer from a part of said chip and to leave said layer of photoresist in the area over said air bridge region; and
   removing the remainder of said layer of said photoresist.

10. The method of claim 9, wherein said protective layer comprises a polyimide.

11. The method of claim 10, wherein the step of applying said protective layer comprises spraying sufficient polyimide solution to obtain a thickness of four to six micrometers of said polyimide on said chip and said substrate.

12. The method of claim 10, wherein the step of removing said protective layer comprises soaking said protective layer in a dilute organic base.

13. The method of claim 9, wherein said polymeric film layer comprises a polyimide.

14. The method of claim 13, wherein the step of applying said polymeric film layer comprises applying a thermoplastic adhesive between a surface of said polymeric film layer and surfaces of said chip and said substrate.

15. The method of claim 14, wherein the step of applying said polymeric film layer comprises lamination of a type selected from the group consisting of vacuum lamination and pressure lamination at a temperature in the range of 240° C. to 260° C.

16. The method of claim 9, wherein said protective layer comprises a fluorocarbon.

17. The method of claim 16, further including the step of applying an adhesion layer on said protective layer prior to applying said layer of photoresist.

18. The method of claim 17, wherein said adhesion layer comprises TiW.

19. The method of claim 6, wherein said protective layer comprises a photoresist, and wherein the step of removing said protective layer from said portion of said chip and said substrate comprises exposing said protective layer to actinic radiation in predetermined areas and developing said protective layer so as to leave said protective layer in selected areas and remove said protective layer from said portion of said chip.

20. The method of claim 19, wherein said protective layer comprises a negative photoresist.

21. The method of claim 20, wherein the step of applying said polymeric film layer comprises applying a thermoplastic adhesive between a surface of said polymeric film layer and surfaces of said chip and said substrate.

22. The method of claim 21, wherein said polymeric film layer comprises siloxane polyimide.

23. The method of claim 22, wherein the step of applying a polymeric film layer comprises vacuum laminating said polymeric film layer at a temperature ranging from 160° C. to 200° C.

24. The method of claim 19, wherein said protective layer comprises ammonium dichromate and gelatin and wherein the step of removing said protective layer comprises soaking said protective layer in a solution of sodium hypochlorite.

25. A method for preserving an air bridge structure on an integrated circuit chip having chip pads, comprising the steps of:
applying a solvent-removable protective layer over said air bridge structure to support said structure on all sides, wherein said protective layer does not significantly change solubility characteristics upon exposure to temperatures of about 260° C.;
positioning said chip in a substrate;
applying a polymeric film layer over said chip and said substrate;
providing vias in said polymeric film layer aligned with predetermined ones of said chip pads;
providing a pattern of electrical conductors on said polymeric film layer extending through said vias for interconnecting said chip in a circuit;
removing said polymeric film layer from the area over said air bridge structure; and
removing said protective layer.

26. The method of claim 25, wherein the step of applying a protective layer under said air bridge structure comprises applying said protective layer on said chip and removing said protective layer from a portion of said chip not including an area under said air bridge.

27. The method of claim 26, wherein said protective layer comprises a positive photoresist, and wherein the step of removing said protective layer from said portion of said chip comprises exposing said protective layer to actinic radiation except where said radiation is blocked by said air bridge, and developing said protective layer so as to leave said protective layer in the area under said air bridge.

28. The method of claim 27, wherein said polymeric film layer comprises siloxane polyimide.

29. The method of claim 27, wherein the step of removing said protective layer comprises soaking said protective layer in an aromatic hydrocarbon.

30. The method of claim 27, wherein said protective layer comprises polymethyl methacrylate and wherein the step of removing said protective layer comprises soaking said protective layer in a solution of toluene.

* * * * *